United States Patent [19]
Ohizumi

[11] Patent Number: 5,357,509
[45] Date of Patent: Oct. 18, 1994

[54] DATA WRITING DURING PROCESS OF DATA RESTORATION IN ARRAY DISK STORAGE SYSTEM

[75] Inventor: Yumiko Ohizumi, Kawasaki, Japan

[73] Assignee: Fujitsu Limited, Kawasaki, Japan

[21] Appl. No.: 801,572

[22] Filed: Dec. 2, 1991

[30] Foreign Application Priority Data

Nov. 30, 1990 [JP] Japan .................. 2-339963

[51] Int. Cl.⁵ .............................. G06F 11/00
[52] U.S. Cl. ........................ 371/10.1; 371/7; 364/245
[58] Field of Search ............ 371/10.1, 8.1, 7; 395/575; 331/11.1; 364/245

[56] References Cited

U.S. PATENT DOCUMENTS

| | | | |
|---|---|---|---|
| 4,817,035 | 3/1989 | Timsit | 364/900 |
| 4,849,929 | 7/1989 | Timsit | 364/900 |
| 4,899,342 | 2/1990 | Potter et al. | 371/10.1 |
| 4,912,698 | 3/1990 | Bitzinger et al. | 370/13 |
| 5,077,736 | 12/1991 | Dunphy, Jr. et al. | 371/10.1 |
| 5,088,081 | 2/1992 | Farr | 371/10.1 |
| 5,134,619 | 7/1992 | Henson et al. | 371/40.1 |
| 5,148,432 | 9/1992 | Gordon et al. | 371/10.1 |
| 5,195,100 | 3/1993 | Katz et al. | 371/66 |
| 5,208,813 | 5/1993 | Stallmo | 371/10.1 |
| 5,212,784 | 5/1993 | Sparks | 395/575 |
| 5,258,984 | 11/1993 | Menon et al. | 371/10.1 |
| 5,278,838 | 1/1994 | Ng et al. | 371/10.1 |
| 5,301,297 | 4/1994 | Menon et al. | 395/425 |

FOREIGN PATENT DOCUMENTS 0141245 5/1985 European Pat. Off. .
0156724 10/1985 European Pat. Off. .

Primary Examiner—Robert W. Beausoliel, Jr.
Assistant Examiner—Joseph E. Palys
Attorney, Agent, or Firm—Nikaido, Marmelstein, Murray & Oram

[57] ABSTRACT

In an array disk storage system, when a fault occurs in one of a plurality of regular disk storages and a disk storage for parity, restored data generated from data stored in the remaining functioning disks is written to the spare disk storage, and the restored data is copied to a new disk storage which has replaced the faulty disk. The writing of new data is carried out such that new data is written to both the spare disk storage and the new disk storage to which a writing of the restored data from the spare disk storage is being carried out, in response to an instruction from an upper grade device to write the new data.

7 Claims, 11 Drawing Sheets

Fig. 5    DEVICE STATE TABLE

| DEVICE | | CONNECTION WITH HOST COMPUTER | CURRENTLY USABLE | FAULT EXISTS | INITIALIZATION STATE | RESTORATION STATE |
|---|---|---|---|---|---|---|
| LOGIC DEVICE No. 1 | ELEMENT 0 | X | X | | | |
| | ELEMENT 1 | X | X | | | |
| | ELEMENT 2 | X | X | | | |
| | ELEMENT 3 | X | X | | | |
| | ELEMENT 4 | X | X | | | |
| | ELEMENT 5 | X | X | | | |
| | ELEMENT 6 | X | | | X | |
| | ELEMENT 7 | X | X | | | |
| | ELEMENT (PARITY) | X | X | | | |
| | ELEMENT (SPARE) | X | X | | | |
| LOGIC DEVICE No. 2 | ELEMENT 0 | X | X | | | |
| | ELEMENT 1 | X | | X | | |
| | ELEMENT 2 | X | X | | | |
| | ELEMENT 3 | | | | | |
| | ELEMENT 4 | | | | | |
| | ELEMENT 5 | | | | | |

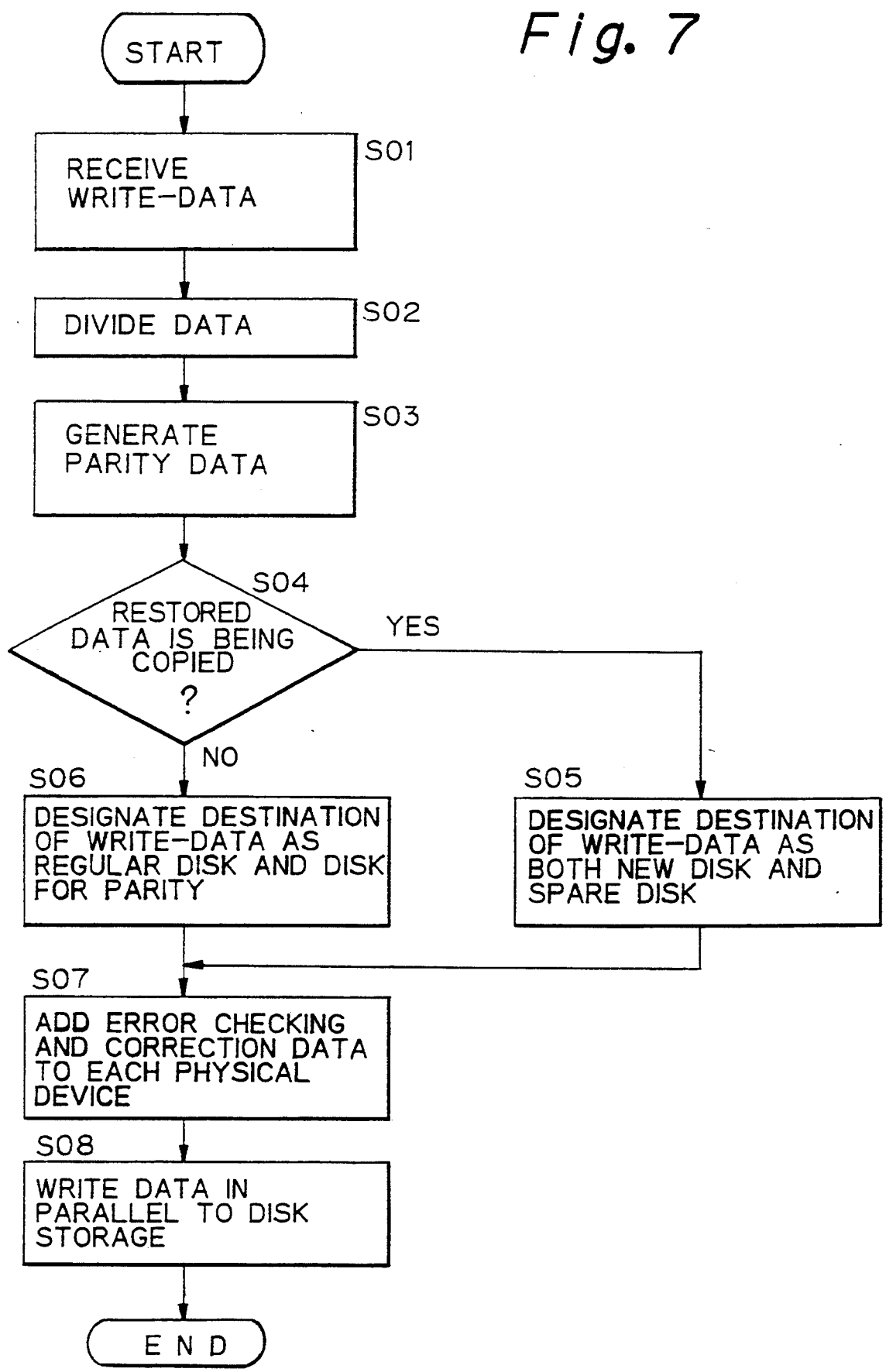

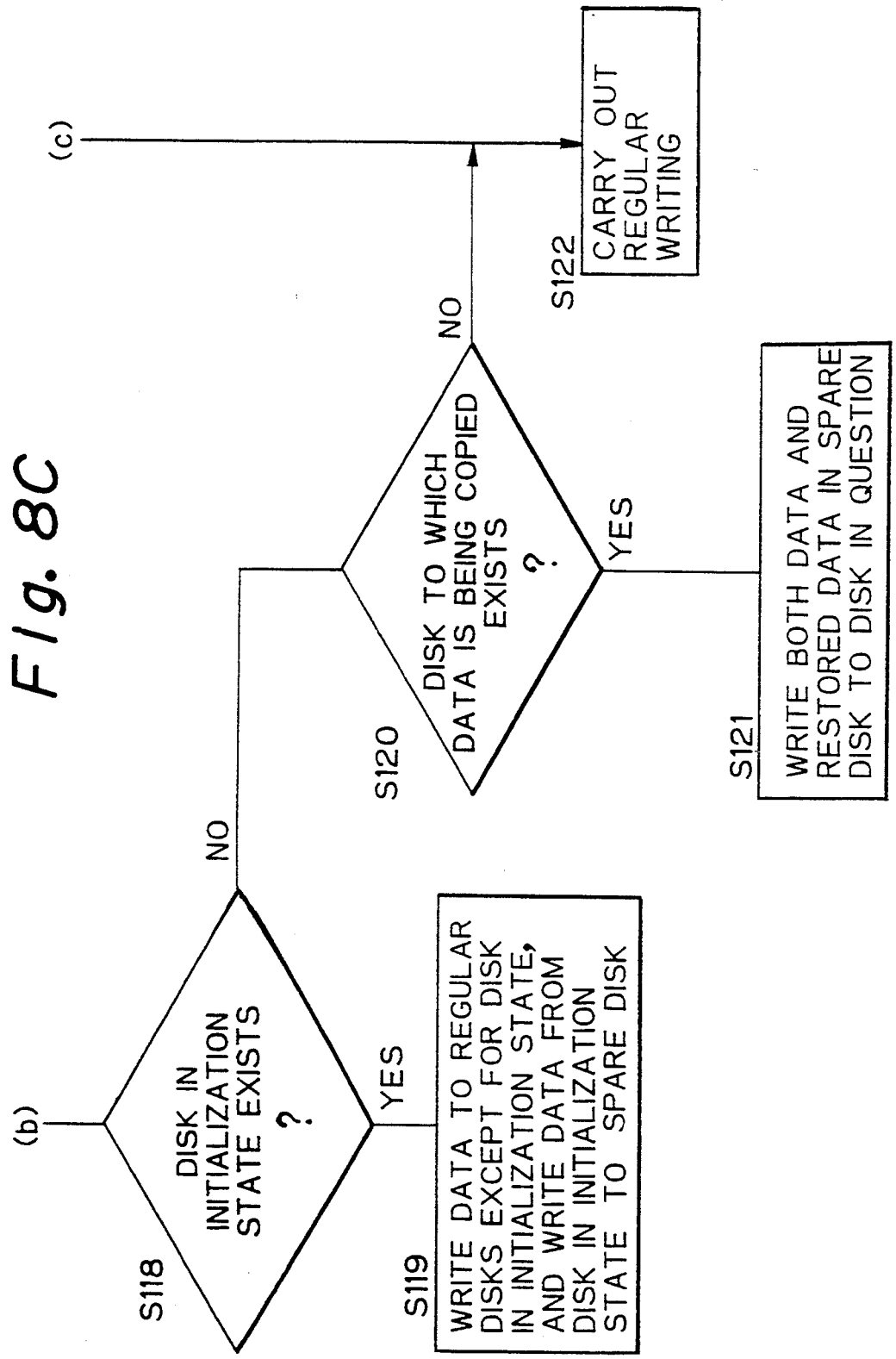

DATA WRITING DURING PROCESS OF DATA RESTORATION IN ARRAY DISK STORAGE SYSTEM

BACKGROUND OF THE INVENTION

1. Field of the Invention

The present invention relates to a method and apparatus for writing data into disk storages in an array disk storage system. The method and apparatus according to the present invention are applicable to an array disk storage system, a multi-volume data storing system, and the like, for processing data by a computer.

2. Description of the Related Arts

In general, in an array disk storage system having an array of disk storages, a plurality of regular disk storages, e.g., eight disk storages, and a disk storage for parity data are provided. Data writing and data reading are carried out to and from the regular disk storages, and the parity data generated from the data to be written to the regular disk storages is written to the disk storage for parity data. Therefore, if one of the disk storages becomes faulty, the data can be restored from the remaining functioning disk storages, and accordingly, the operation of reliability of the system is ensured.

In the array disk system, when a number equal to or more than a predetermined number of faults in the disk storages are detected, the detected faulty disk storage is excluded, a spare disk storage is used as a replacement for the excluded faulty disk storage, and the restored data generated from the remaining functioning disk storages is written to the spare disk storage.

After the faulty disk storage is repaired and brought back to the functioning state, or is replaced by a fresh disk storage as a new disk storage, the data stored in the spare disk storage is written, i.e., copied, to the new disk storage, to restored a normal operating state.

In this case, if the copying of the restored data from the spare disk storage to the new disk storage is interrupted, and a new data is written to a portion of the region of the spare disk storage from which a writing of restored data to the new disk storage has been completed in accordance with a write instruction from an upper grade device, this operation becomes complex and disadvantageous in that the data of the disk storages in the data restoring operation must be changed, and that a separate copying of the data in the above-mentioned portion of the region of the spare disk storage, and a storage of the address of this portion of the region, become necessary.

Also, if new data is written to a portion of the region of the new disk storage to which the copying, of the restored data from the spare disk storage is to be carried out, the process becomes complex and disadvantageous in that the new data written to the above-mentioned portion of the region must be saved, to prevent the destruction of the written new data by the subsequent writing of the restored data, or a subsequent writing of the restored data must be prohibited.

SUMMARY OF THE INVENTION

An object of the present invention is to provide an improved method and apparatus for writing data to disk storages in an array disk storage system in which new data is written to both the disk storage and a new disk storage to which restored data from the spare disk storage is being written, in response to an instruction to write the new data from an upper grade device, so that the above-described complexities and disadvantages found in the prior art are eliminated and the writing of the new data during the data restoration process in the disk storages is carried out quickly and in a simple manner.

Therefore, accordance with an aspect of the present invention, there is provided a method of writing data to disk storages in an array disk storage system during a process of data restoring of the disk storages; the array disk storage system including a plurality of regular disk storages for storing data, a spare disk storage for use when a fault occurs in the disk storages, and a control device for controlling an input and output of data to and from the disk storages, under a control of an upper grade device; when one of the plurality of regular disk storages and the disk storage for parity becomes faulty, restored data generated from data stored in the remaining functioning disks is written to the spare disk storage, and the restored data is copied to a new disk storage which has replaced the faulty disk. A writing of new data is carried out in a manner such that new data is written to both the spare disk storage and the new disk storage to which a writing of the restored data from the spare disk storage is being carried out, in response to an instruction from the upper grade device to write the new data.

BRIEF DESCRIPTION OF THE DRAWINGS

FIG. 5 shows an example of the device state table used in the embodied method;

FIG. 7 shows a flow chart of the basic processes in the embodied method;

FIGS. 8A, 8B, and 8C show an example of the flow chart of processes of the embodied method.

DESCRIPTION OF THE PREFERRED EMBODIMENTS

Before describing the preferred embodiments of the present invention, a prior art array disk storage system is explained with reference to FIG. 1. The prior art array disk storage system of FIG. 1 includes a plurality of regular disk storages 10, 11, 12, . . . 1n, and a disk storage 2 for parity, an array disk control device 4, and an upper grade device. Data writing and data reading are carried out to and from the regular disk storages 10, 11, 12, . . . 1n, and the parity data generated from the data to be written to the regular disk storages is written to the disk storage 2 for parity data.

Figure 1:
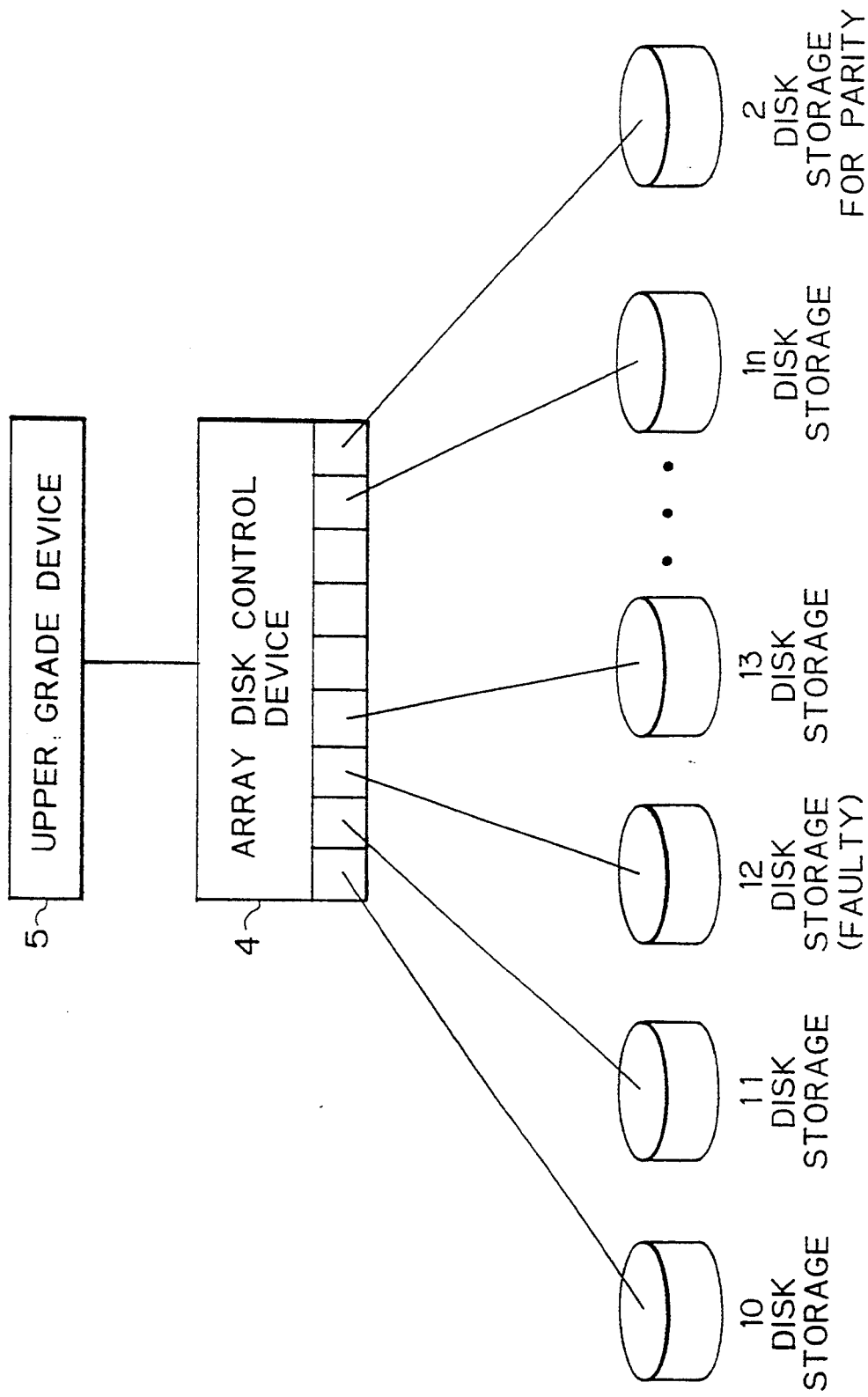
FIG. 1 shows a general arrangement of a prior art array disk storage system.

In the system of FIG. 1, if one of the disk storages, e.g., disk storage 12, becomes faulty, the data can be restored from the remaining functioning disk storages, e.g., disk storages 10, 11, 13, . . . 1n, and the disk storage 2 for parity data, and accordingly, the operational reliability of the system is ensured.

Figure 2:
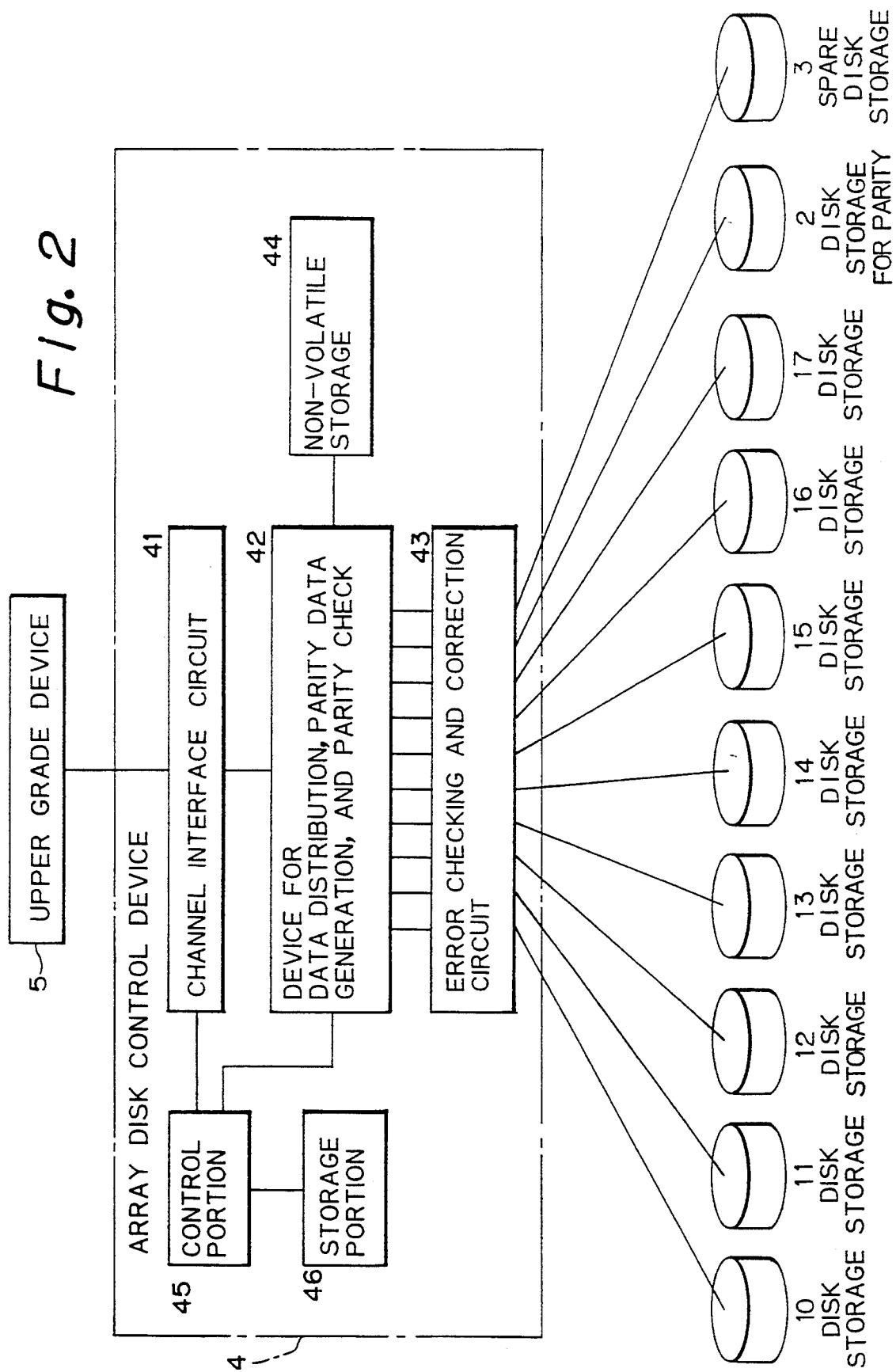
FIG. 2 is a schematic diagram of the apparatus to which the method of writing data to disk storages according to an embodiment of the present invention is applicable.

An apparatus to which the method of writing data to disk storages according to an embodiment of the present invention is applicable is shown in FIG. 2. The apparatus of FIG. 2 includes eight regular disk storages 10, 11, . . . 17, a disk storage 2 for parity data, a spare disk storage 3, an array disk control device 4 having a channel interface circuit 41, a control portion 45, a storage portion 46, a device 42 for data distribution, a parity data generation, and parity check, non-volatile storage 44, an error checking and correction circuit 43, and an upper grade device 5.

An exchange of information between the array disk control device 4 and upper grade device, e.g., a channel device, is carried out by the interface circuit 41, and a control of the array disk control device 4 is carried out by the control portion 45 as a central processing unit. A program is stored in the storage portion 46.

For data writing, the device 42 for a data distribution, parity data generation, and parity check arranges the data supplied from the channel device in sequence for a successive distribution to the plurality 10 of disk storages, for example, in the form of a distribution per one byte, and parity data is generated from the distributed data. For data reading, a parity check of the data read from the disk storages is carried out based on the parity data, the read data is corrected, if necessary, based on the result of the parity check, and the corrected data successively delivered to the channel device. Where one of the disk storages becomes faulty, the data is restored based on the data read from the remaining functioning disk storages.

The error checking and correction circuit 43 generates error checking and correction data for each block of data to be written to a disk storage, the generated error checking and correction data is added to the data block, and the data is checked and corrected based on the read error checking and correction data.

The divided data are written in parallel to disk storages 10 to 17 under the control of a rotation synchronize control circuit, and parity data generated on the basis of the divided data is written to the disk storage 2 for parity.

When one of the regular disk storages 10, 11, . . . 17 and disk storage 2 for parity becomes faulty, the data restored from the data read from the remaining functioning disk storages is written to spare disk storage 3.

The information on the statuses of the regular disk storages 10, 11, . . . 17, disk storage 2 for parity, and spare disk storage 3, e.g., the states of being connected, being available, being faulty, being initialized, being restored, etc., are stored in a non-volatile storage 44.

The operation of the apparatus of FIG. 2 is as follows. First, upon receipt of a write instruction from the upper grade device 5, the data is divided by the device 42 for data distribution, parity data generation and parity check, error checking and correction data are added to the data for each data block, and the produced data are written in parallel to regular disk storages 10, 11, . . . 1n, and the disk storage 2 for parity.

Next, when one of the regular disk storages 10, 11, . . . 1n, and disk storage 2 for parity data becomes faulty, the faulty disk storage is excluded, and the writing state of the excluded faulty disk storage in the device state table (FIG. 5) stored in the non-volatile storage 44 is changed to the fault state.

Then, after excluding the faulty disk storage, in an available period between read/write operations, the data is read by device 42 for data distribution, parity data generation and parity check from the remaining functioning disk storages and the disk storage 2 for parity data, the data is restored accordingly, the error checking and correction data is added to the restored data, and the produced data is written to the spare disk storage 3. After the start of the restoration operation, the data to be written to the faulty disk storage is written to spare disk storage 3.

Further, after the repair of the faulty disk storage is completed, or the faulty disk storage is replaced by a fresh disk storage, the new disk storage is initialized, the data restored and written in the spare disk storage 3 in the available period between read/write operations is read from the spare disk storage 3, and the read data is copied to the disk storage which has been initialized.

Finally, if the array disk control device 4 receives a write instruction from the upper grade device 5 while the writing of the read data to the disk storage which has been initialized completed is being carried out, the writing of the instructed data is carried out to both the spare disk storage, as the source of the restored data, and the disk storage as the destination of the restored data.

Figure 3:
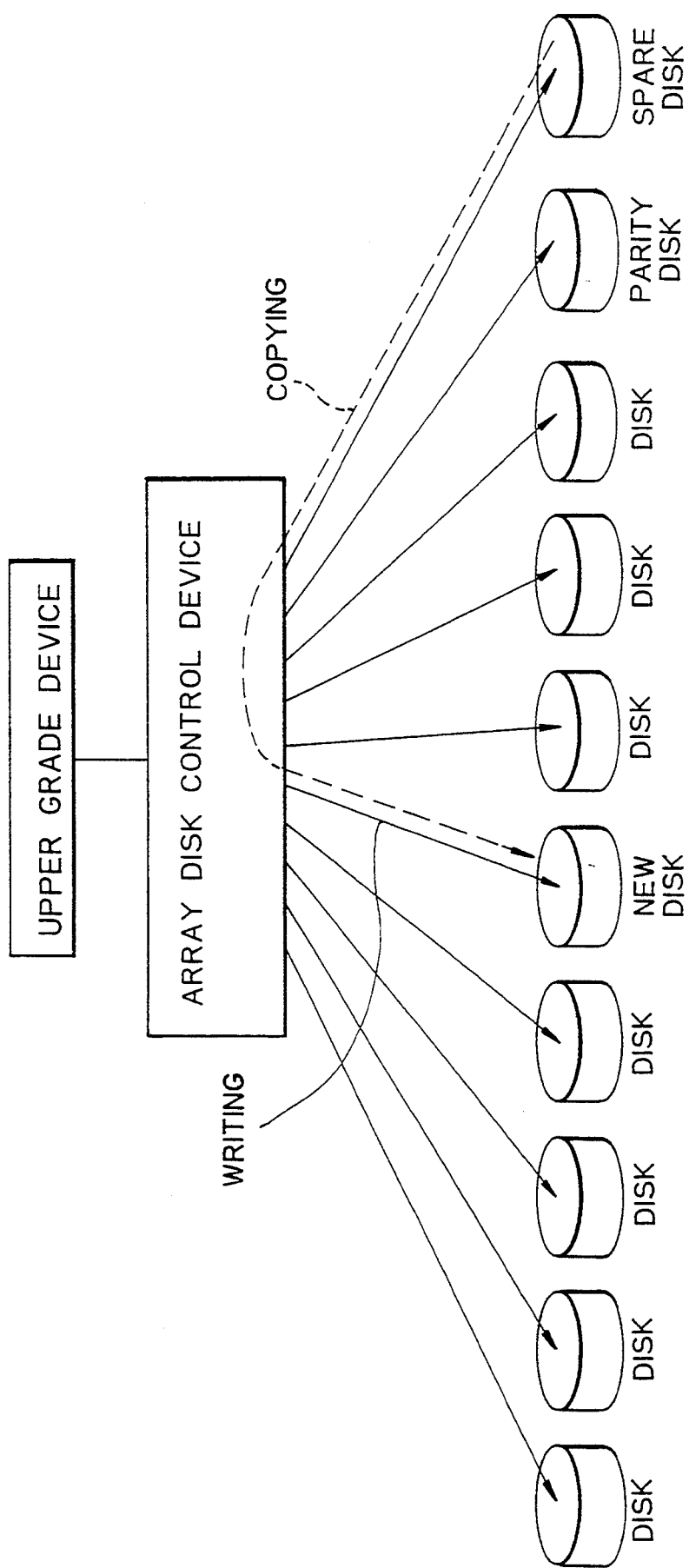
FIG. 3 illustrates the routes of copying and writing to the disk storages in the embodied method.
Figure 4:
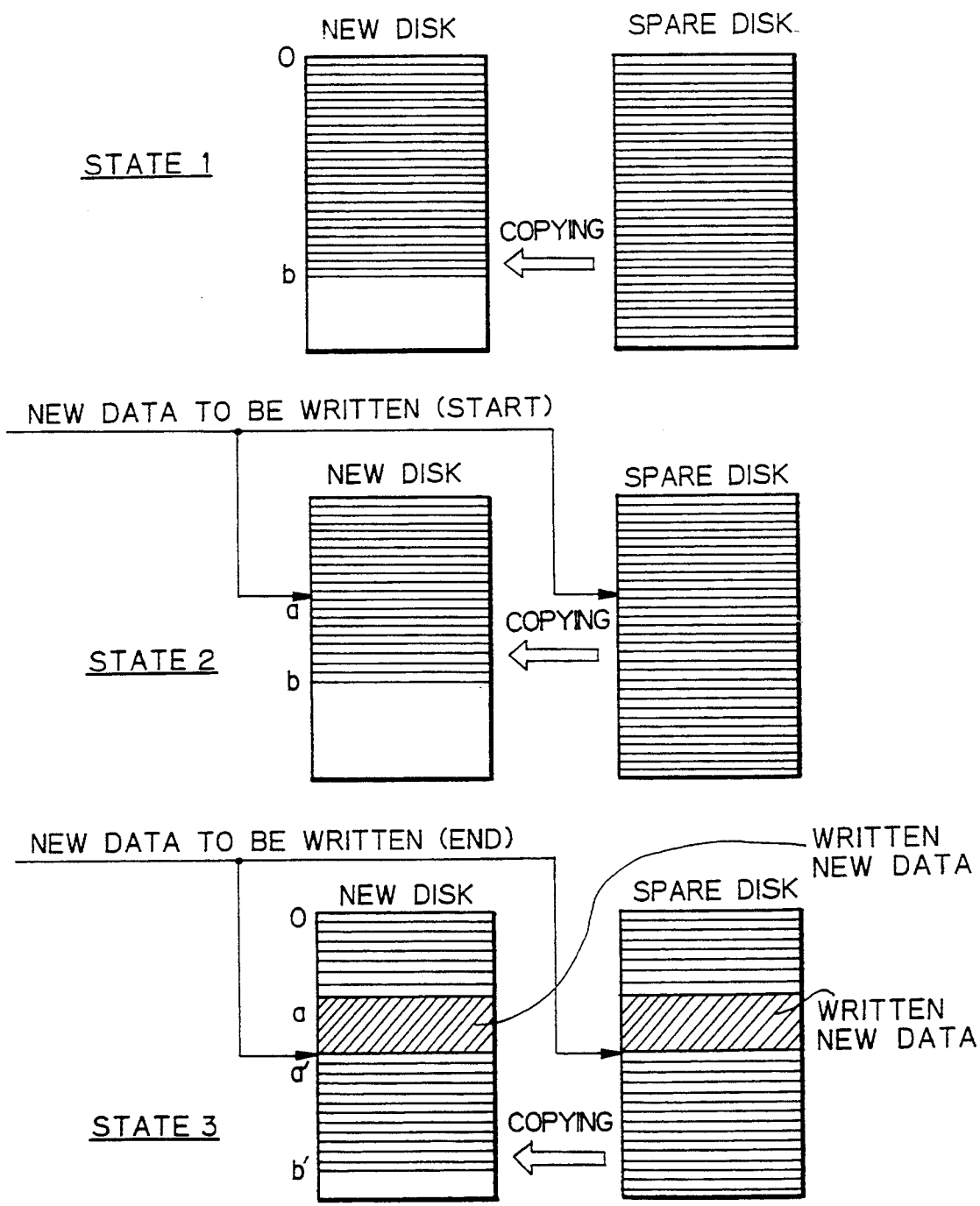
FIG. 4 illustrates the copying and writing to the disk storage in the embodied method.

The routes and the manner of copying and writing to the disk storages by the method according to an embodiment of the present invention are illustrated in FIGS. 3 and 4. The restored data stored in the spare disk is transmitted for copying from the spare disk through the array disk control device to the new disk.

In FIG. 4, in STATE 1, the restored data stored in the spare is copied from the spare disk to the new disk at an address "b". In STATE 2, the writing of the new data is started, in accordance with the instruction to write data to the region between addresses "a" and "a", from the upper grade device. The writing of the new data is started at address "a". In STATE 3, the writing of the new data is terminated at address "a". Accordingly, the new data is written to both the new disk and the spare disk.

An example of the device state table used in the method according to an embodiment of the present method is shown in FIG. 5 wherein, for example, LOGIC DEVICE No. 1 corresponds to a disk storage in an array disk storage system. For example, a data of 8 bytes instructed to be written by the upper grade device is divided into eight data of 1 byte, the divided data of 1 byte are written in parallel to ELEMENT 0 through ELEMENT 7 as a block formation, a parity data of 1 byte is generated from the bits of the divided data of 1 byte, and the generated parity data is written to the disk for parity data as ELEMENT (PARITY). The data in a faulty disk is written as restored data to the spare disk as ELEMENT (SPARE).

Each of the disk storages, as ELEMENTs 0 to 7, ELEMENT (PARITY), and ELEMENT (SPARE), is administrated in accordance with the state of the disk storages, such as connection with host computer, currently usable, fault exists, initialization state, and restoration state.

Figure 6:
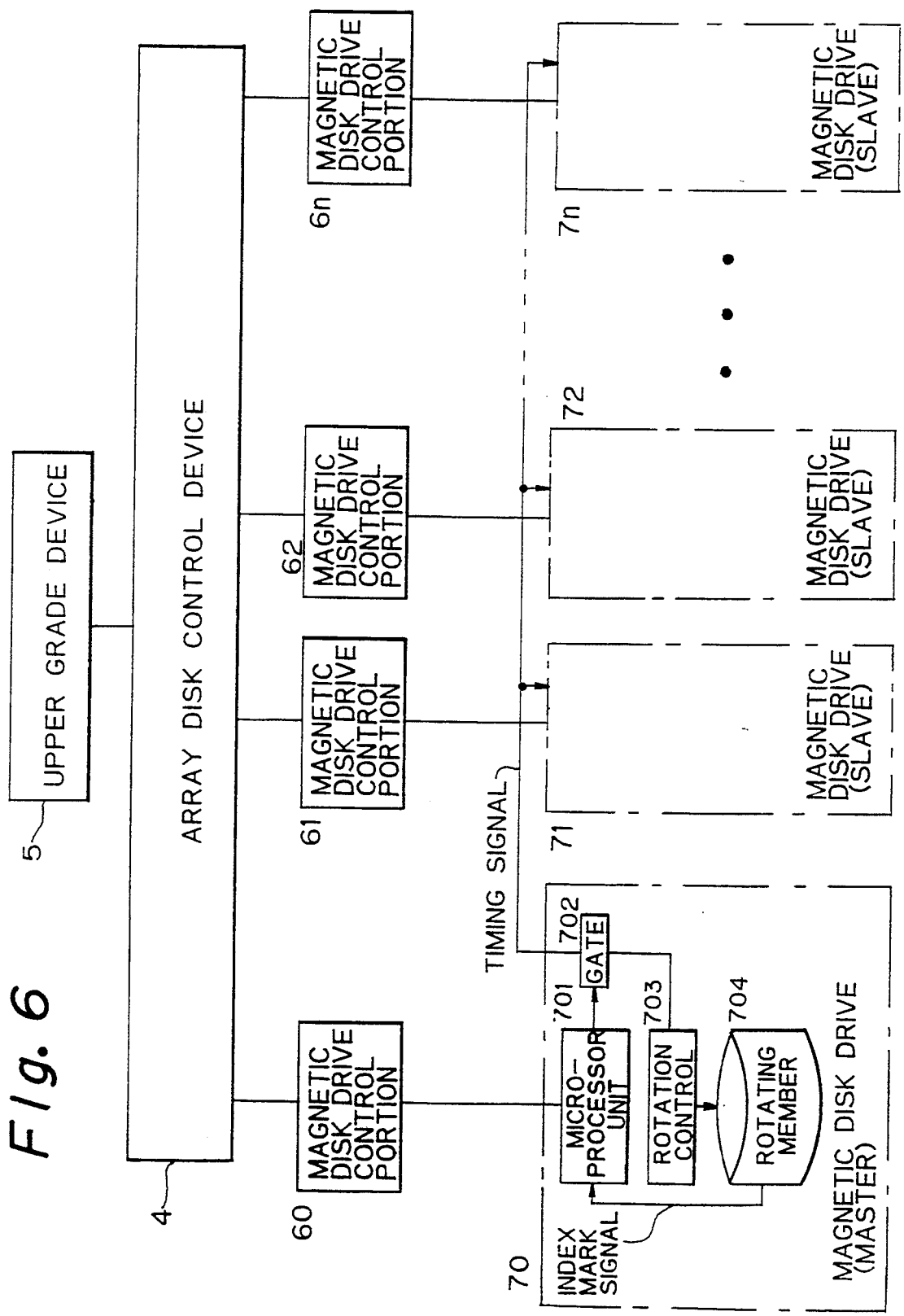
FIG. 6 shows an example of the structure of a rotation synchronize control circuit used in the embodied method.

An example of the structure of a rotation synchronize control circuit used in the method according to an embodiment of the present invention is shown in FIG. 6. A plurality of magnetic disk drives consists of one magnetic disk drive (master) 70 and n magnetic disk drives (slaves) 71, 72 . . . 7n. The timing signals delivered from the magnetic disk drive (master) 70 are supplied in parallel to the magnetic disk drives (slaves) 71, 72, . . . 7n at predetermined intervals. Each of the magnetic disk drives (slave) 71, 72, . . . 7n is operated upon receipt of the supplied timing signal, and accordingly, the rotation of the magnetic disk drives (slaves) 71, 72, . . . 7n is synchronized with the rotation of magnetic disk drive (master) 70.

In the magnetic disk drive (master) 70, the index mark signal delivered from a rotating member 704 is supplied to a microprocessor unit 701, the signal delivered from the microprocessor unit 701 is supplied to a gate circuit 702, and the output of gate circuit 702 is supplied as the timing signal to magnetic disk drives (slaves) 71, 72, . . . 7n.

A flow chart of the basic processes used in the method according to an embodiment of the present invention is shown in FIG. 7. Write data of, for example, 8 bytes is received from a channel device, i.e., upper grade device, (S01), and the 8 byte write-data is divided into eight 1 byte data (S02). A parity data of 1 byte is generated from the bits of the eight 1 byte data (S03), and whether or not the restored data in the spare disk storage is being copied from the spare disk storage to the new disk storage is determined (S04).

If the result is YES, the destination of the write-data is designated as both the new disk storage and the spare disk storage (S05). If result is NO, the destination of the write-data is designated as the regular disk storages and the disk storage for parity data (S06). Error checking and correction data is added to each physical device (S07), and the write-data are written in parallel to the disk storages (S08).

Figure 8A:
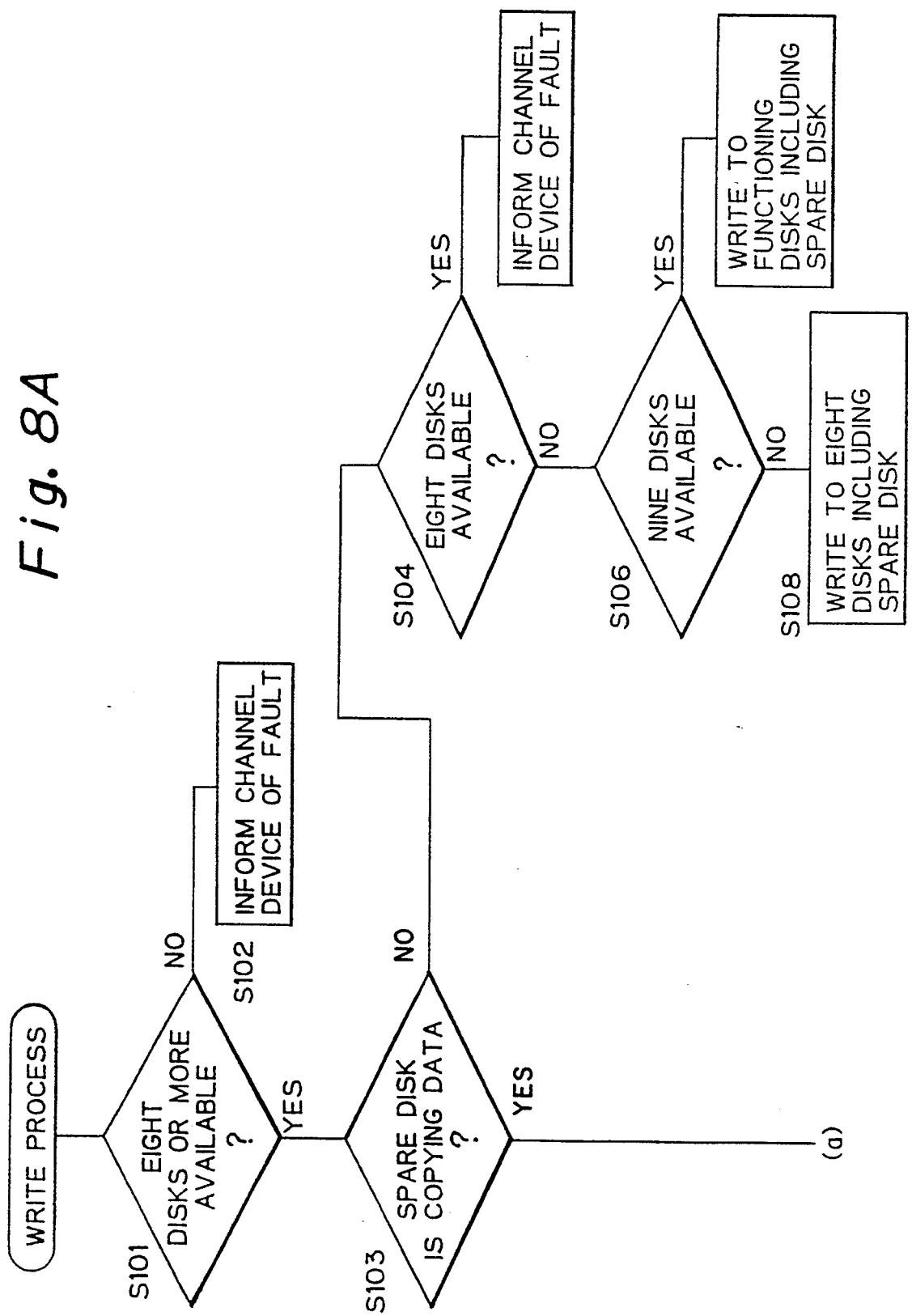
Figure 8B:
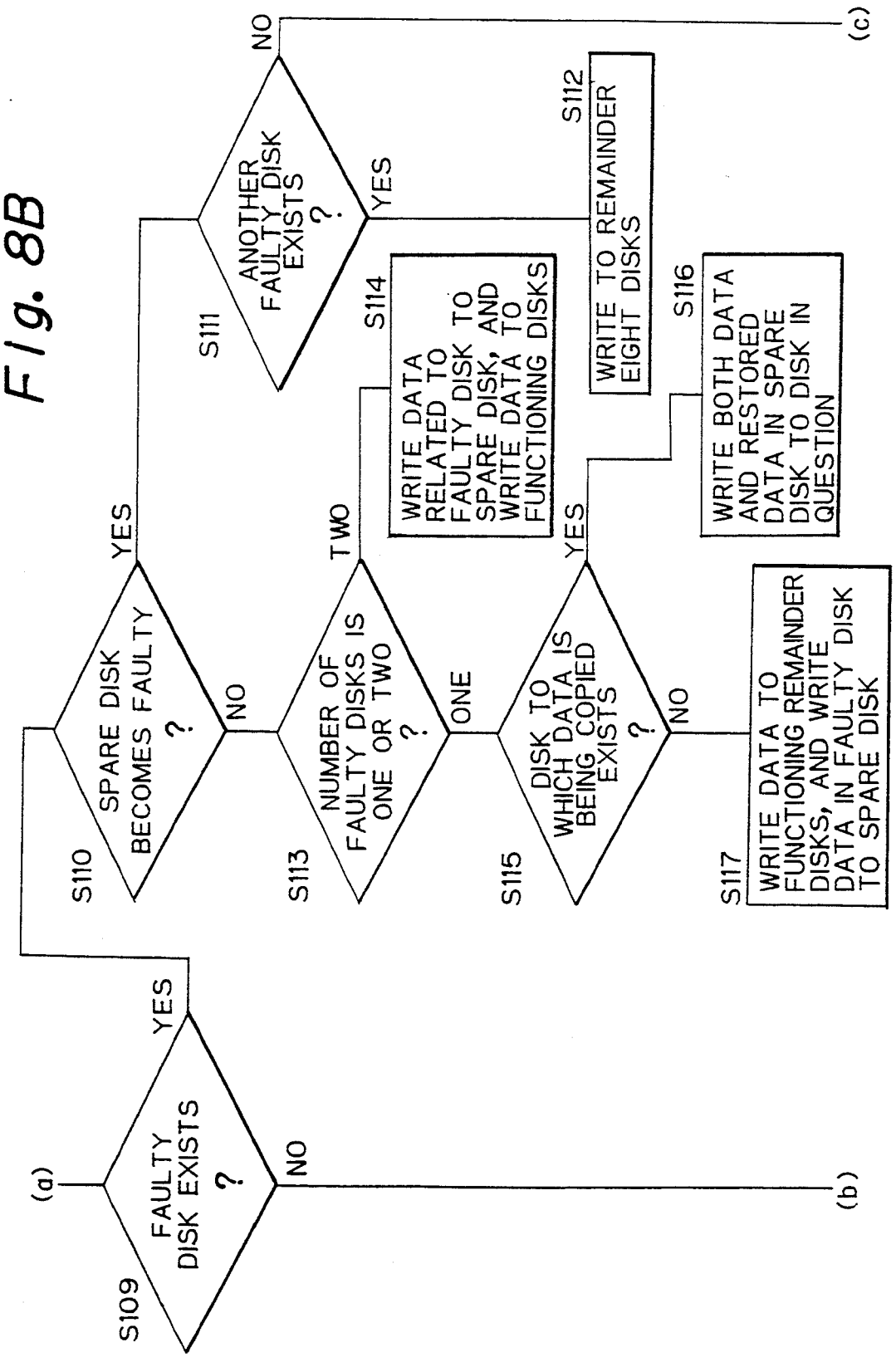

An example of the flow chart of the processes of the method according to an embodiment of the present invention is shown in FIGS. 8A, 8B, and 8C. With regard to the write process, steps S101 to S108 are shown in FIG. 8A, steps S109 to S117 in FIG. 8B, and steps S118 to S121 in FIG. 8C.

In S101, it is determined whether or not eight disks or more are available; in S102, the channel device is informed of a fault; in S103, it is determined whether or not the spare disk is copying data; in S104, it is determined whether or not eight disks are available; in S105, the channel device is informed of a fault; in S106, it is determined whether or not nine disks are available; in S107, data is written to functioning disks including the spare disk; and in S108, data is written to eight disks including the spare disk.

In S109, it is determined whether or not a faulty disk exists; in S110, it is determined whether or not the spare disk is faulty; in S111, it is determined whether or not another faulty disk exists; in S112, the data is written to remainder eight disks; and in S113, it is determined whether the number of faulty disks is one or two. In S114, data related to the faulty disk is written to the spare disk, and the data is written to the functioning disks. Then, in S115, it is determined whether or not a disk to which data is being copied exists, and in S116, both the data and the restored data in the spare disk are written to the disk in question. In S117, the data is written to the remaining functioning disks, and the data in the faulty disk is written to the spare disk.

In S118, it is determined whether or not a disk in the initialization state exists; and in S119, the data is written to the regular disks other than the disk in the initialization state, and the data from the disk in the initialization state is written to the spare disk. In S120, it is determined whether or not a disk to which the data is being copied exists; in S121, both the data and the restored data in the spare disk are written to the disk in question; and in S122, the regular writing is carried out.

Figure 9:
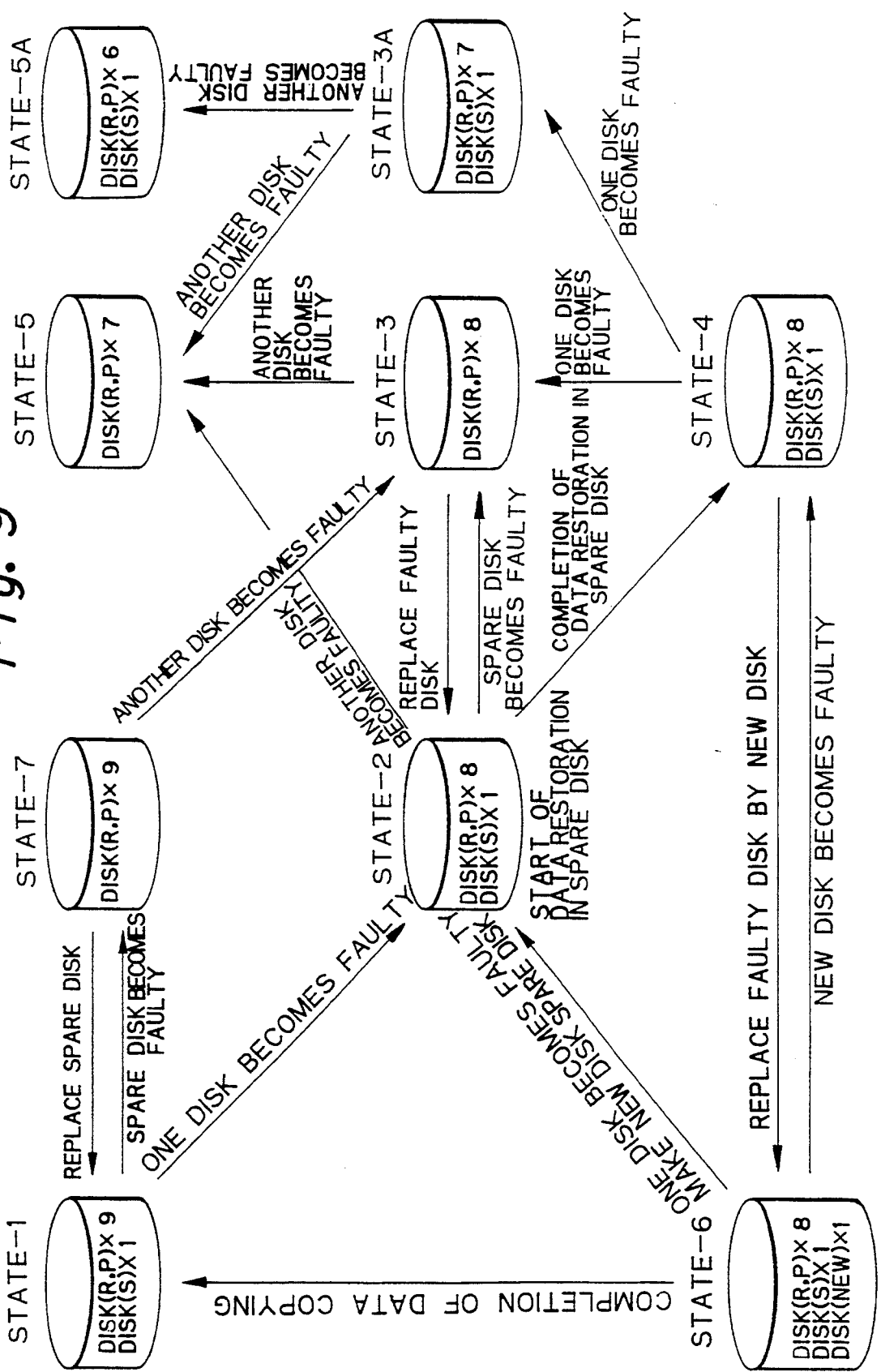
FIG. 9 illustrates a transition of states of the apparatus to which the embodied method is applicable.

The transitions of states of the apparatus to which the method according to an embodiment of the present invention is applicable is illustrated in FIG. 9.

In STATE-1, the disk storages are constituted by nine disk storages consisting of regular disk storages (R), a disk storage for parity (P) and one spare disk storage (S). In STATE-2, where one disk has become faulty, the disk storages are constituted by eight disk storages consisting of regular disk storages (R) and a disk storage for parity (P), and one spare disk storage (S), and the restoration of data in the spare disk storage is started. In STATE-3, where the spare disk storage has become faulty, the disk storages are constituted by eight disk storages consisting of regular disk storages (R) and a disk storage for parity (P). In STATE-5, where another disk storage has become faulty, the disk storage are constituted by seven disk storages consisting of regular disk storages (R) and a disk storage for parity (P).

In STATE-4, where the data restoration in the spare disk has been completed, the disk storages are constituted by eight disk storages consisting of regular disk storages (R) and a disk storage for parity (P), and one spare disk storage (S). In STATE-3A, where one disk storage has become faulty, the disk storages are constituted by seven disk storages consisting of regular disk storages (R) and a disk storage for parity (P). In STATE-5A, where another disk storage has become faulty, the disk storages are constituted by six disk storages consisting of regular disk storages (R) and a disk storage for parity (P).

In STATE-6, where the faulty disk storage has been replaced by a new disk storage, the disk storages are constituted by eight disk storages consisting of regular disk storages (R) and a disk storage for parity (P), one spare disk storage, and a new disk storage (NEW). In STATE-7, where the spare disk storage has become faulty, the disk storage are constituted by nine disk storages consisting of regular disk storages (R) and a disk storage for parity (P).

I claim:

1. A method of writing data to disk storages in an array disk storage system during a process of restoring data in said disk storages;
    said array disk storage system including a plurality of regular disk storages for storing data, a spare disk storage used when a fault occurs in the disk storages, a disk storage for parity, and a control device for controlling an input and output of data to and from the disk storages under a control of an upper grade device, the method comprising the steps of:
    when one of the plurality of regular disk storages and the disk storage for parity becomes faulty, restored data generated from the data stored in a functioning remainder of the plurality of disk storages is written to the spare disk storage, and the restored data is copied to a new disk storage which has replaced the faulty disk storage,
    wherein writing of new data is carried out such that new data is written to both the spare disk storage and the new disk storage to which writing of restored data from the spare disk storage is being carried out, in response to an instruction from the upper grade device to write the new data, said writing of new data being carried out while the restored data which is restored in the spare disk storage is being coped into the new disk storage.

2. An apparatus for writing data into disk storages in an array disk storage system during a process of restoring data in disk storages; said apparatus comprising:
a plurality of regular disk storages to which data is to be written;
a disk storage for parity to which parity data generated from the data written to the regular disk storages is to be written;
a spare disk storage to which restored data generated from the data read from functioning disk storages is to be written when a fault occurs in one of the regular disk storages and the disk storage for parity; and
control means for controlling input and output of data to and from the disk storages, under the control of an upper grade device;
said control means comprising means for writing new data to both the spare disk storage and a new disk storage to which writing of restored data from the spare disk storage is being carried out, in response to an instruction from the upper grade device to write the new data, said writing into the spare disk and the new disk by the control means being carried out while the restored data which is restored in the spare disk storage is being copied into the new disk storage.

3. An apparatus according to claim 2, wherein said control means includes:
a channel interface circuit connected to an upper grade device; a device for data distribution, parity data generation and parity check connected to said channel interface circuit; an error checking and correction circuit connected to said data distribution device; a non-volatile storage connected to said data distribution device; a control portion connected to said channel interface circuit and data distribution device; and a storage portion connected to said control portion.

4. An apparatus according to claim 3, wherein said error checking and correction circuit is connected to regular disk storages, a disk storage for parity, and a spare disk storage.

5. A method of writing data into disk storages in a multi-volume data storing system,
said multi-volume data storing system including a plurality of disk storages for storing data, a spare disk storage for use when a fault occurs in the disk storages, and a control device for controlling input and output of data at the disk storages said method comprising the steps of,
when one of the plurality of disks becomes faulty, data restored from data stored in the remaining functioning disks is written to the spare disk storage, and the restored data is copied to a new disk storage which has replaced the faulty disk storage,
wherein writing of new data is carried out such that new data is written to both the spare disk storage and the new disk storage to which a writing of the restored data from the spare disk storage is being carried out, in response to an instruction for a writing of the new data through the control device, without determining whether the region to which the new data is to be written is a region to which the writing of the restored data has been completed.

6. A method of writing data to disk storages in an array disk storage system, said method comprising the steps of:
dividing the data to a plurality of divided data;
generating redundancy data for the plurality of divided data;
providing a plurality of disk storages and a spare disk storage, the plurality of divided data and the redundancy data being stored to the plurality of disk storages;
generating restored data based upon the data stored in a remainder of the plurality of disk storages, when one of the plurality of disk storages become faulty;
writing the restored data to the spare disk storage;
copying the restored data in the spare disk storage to a new disk storage which has replaced the faulty disk storage; and
in response to an instruction of which new data to be written to disk storages in the array disk storage system during the copying step, writing new divided data for the new disk storage to both the new disk storage and the spare disk storage.

7. An apparatus for writing data into disk storages in an array disk storage system, comprising:
means for dividing the data to a plurality of divided data;
means for generating redundancy data for the plurality of divided data;
a plurality of disk storages, the plurality of divided data and the redundancy data being stored to the plurality of disk storages;
a spare disk storage;
means for generating restored data, when one of the plurality of disk storages becomes faulty, based upon the data stored in a remainder of the plurality of disk storages, and for writing the restored data to the spare disk storage; and
means for copying the restored data in the spare disk storage to a new disk storage which has replaced the faulty disk storage, and for writing new divided data for the new disk storage to both the new disk storage and the spare disk storage in response to an instruction of which new data to be written to disk storages in the array disk storage system during the copying of the restored data.

* * * * *